(12) United States Patent
Flitsch

(10) Patent No.: US 9,159,592 B2
(45) Date of Patent: Oct. 13, 2015

(54) METHOD AND APPARATUS FOR AN AUTOMATED TOOL HANDLING SYSTEM FOR A MULTILEVEL CLEANSPACE FABRICATOR

(71) Applicant: Frederick A. Flitsch, New Windsor, NY (US)

(72) Inventor: Frederick A. Flitsch, New Windsor, NY (US)

(73) Assignee: Futrfab, Inc., New Windsor, NY (US)

(*) Notice: Subject to any disclaimer, the term of this patent is extended or adjusted under 35 U.S.C. 154(b) by 37 days.

(21) Appl. No.: 14/134,705

(22) Filed: Dec. 19, 2013

(65) Prior Publication Data

US 2014/0180469 A1    Jun. 26, 2014

Related U.S. Application Data

(60) Continuation-in-part of application No. 11/502,689, filed on Aug. 12, 2006, and a continuation-in-part of application No. 14/024,335, filed on Sep. 11, 2013, which is a division of application No. 11/933,280, filed on Oct. 31, 2007, now Pat. No. 8,641,824, which is a division of application No. 11/156,205, filed on Jun. 18, 2005, now Pat. No. 7,513,822.

(60) Provisional application No. 61/745,996, filed on Dec. 26, 2012, provisional application No. 60/596,173, filed on Sep. 6, 2005, provisional application No. 60/596,099, filed on Aug. 31, 2005, provisional application No. 60/596,053, filed on Aug. 26, 2005, provisional application No. 60/596,035, filed on Aug. 25, 2005, provisional application No. 60/595,935, filed on Aug. 18, 2005.

(51) Int. Cl.
| | | |
|---|---|---|
| G06F 7/00 | (2006.01) | |
| G06F 19/00 | (2011.01) | |
| H01L 21/67 | (2006.01) | |
| H01L 21/677 | (2006.01) | |

(52) U.S. Cl.
CPC .... *H01L 21/67017* (2013.01); *H01L 21/67178* (2013.01); *H01L 21/67733* (2013.01); *H01L 21/67736* (2013.01)

(58) Field of Classification Search
CPC combination set(s) only.
See application file for complete search history.

(56) References Cited

U.S. PATENT DOCUMENTS

| | | | |
|---|---|---|---|
| 3,158,457 | A | 11/1964 | Whitefield |
| 3,588,176 | A | 6/1971 | Byrne et al. |
| 3,603,646 | A | 9/1971 | Leoff |
| 3,812,947 | A | 5/1974 | Nygaard |
| 3,930,684 | A | 1/1976 | Lasch, Jr. et al. |
| 3,976,330 | A | 8/1976 | Babinski et al. |
| 4,081,201 | A | 3/1978 | Hassan et al. |
| 4,165,132 | A | 8/1979 | Hassan et al. |
| 4,278,366 | A | 7/1981 | Loveless et al. |
| 4,299,518 | A | 11/1981 | Whelan |
| 4,315,705 | A | 2/1982 | Flint |
| 4,348,139 | A | 9/1982 | Hassan et al. |
| 4,409,889 | A | 10/1983 | Burleson |
| 4,501,527 | A | 2/1985 | Jacoby et al. |

(Continued)

*Primary Examiner* — Yolanda Cumbess
(74) *Attorney, Agent, or Firm* — Joseph P. Kincart; Ideation Law, PLLC

(57) ABSTRACT

The present invention provides methods and apparatus capable of routine placement and replacement of fabricator tools in a designated tool location. The tool location can be selected from multiple tool locations arranged in a matrix with horizontal and vertical designations. The operation may be fully automated. In another aspect, the invention describes Cleanspace fabricators which use devices to routinely remove and place tooling.

7 Claims, 7 Drawing Sheets

(56) References Cited

U.S. PATENT DOCUMENTS

| | | |
|---|---|---|
| 4,554,766 A | 11/1985 | Ziemer et al. |
| 4,612,946 A | 9/1986 | Noh et al. |
| 4,620,353 A | 11/1986 | Pryor |
| 4,649,830 A | 3/1987 | Tanaka |
| 4,667,579 A | 5/1987 | Daw |
| 4,667,580 A | 5/1987 | Wetzel |
| 2,682,927 A | 7/1987 | Southworth et al. |
| 4,682,927 A | 7/1987 | Southworth et al. |
| 4,694,736 A | 9/1987 | Yamagata et al. |
| 4,695,215 A | 9/1987 | Jacoby et al. |
| 4,722,659 A | 2/1988 | Hoyt, III et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,139,459 A | 8/1992 | Takahashi et al. |
| 5,145,303 A | 9/1992 | Clarke |
| 5,167,575 A | 12/1992 | MacDonald |
| 5,344,365 A | 9/1994 | Scott et al. |
| 5,425,793 A | 6/1995 | Mori et al. |
| 5,451,131 A * | 9/1995 | Hecht et al. ............... 414/217.1 |
| 5,518,451 A | 5/1996 | Renz et al. |
| 5,562,539 A | 10/1996 | Hashimoto et al. |
| 5,570,990 A | 11/1996 | Bonora et al. |
| 5,779,799 A | 7/1998 | Davis |
| 5,795,356 A | 8/1998 | Leveen |
| 5,848,933 A | 12/1998 | Roberson et al. |
| 5,860,258 A | 1/1999 | Faith et al. |
| 6,082,949 A | 7/2000 | Rosenquist |
| 6,099,599 A | 8/2000 | Wu |
| 6,138,721 A | 10/2000 | Bonora et al. |
| 6,183,358 B1 | 2/2001 | Adair, Jr. |
| 6,220,808 B1 | 4/2001 | Bonora et al. |
| 6,238,283 B1 | 5/2001 | Matsuyama et al. |
| 6,306,189 B1 | 10/2001 | Renz |
| 6,312,525 B1 | 11/2001 | Bright et al. |
| 6,322,597 B1 | 11/2001 | Ohta |
| 6,328,768 B1 | 12/2001 | Ohta |
| 6,338,371 B1 | 1/2002 | Araki et al. |
| 6,574,937 B1 | 6/2003 | Rapisarda et al. |
| 6,582,178 B2 | 6/2003 | Petruccelli |
| 6,598,279 B1 | 7/2003 | Morgan |
| 6,612,084 B2 | 9/2003 | Rapisarda |
| 6,677,690 B2 | 1/2004 | Fosnight et al. |
| 6,736,582 B1 | 5/2004 | Mages et al. |
| 6,854,583 B1 | 2/2005 | Horn |
| 6,869,457 B2 | 3/2005 | Nakagawa |
| 6,875,282 B2 | 4/2005 | Tanaka et al. |
| 6,902,762 B2 | 6/2005 | Miyata |
| 6,955,595 B2 | 10/2005 | Kim |
| 7,014,672 B2 | 3/2006 | Ishihara et al. |
| 7,039,999 B2 | 5/2006 | Tarr et al. |
| 7,083,515 B2 | 8/2006 | Rapisarda et al. |
| 7,257,458 B1 | 8/2007 | Markle |
| 7,269,925 B2 | 9/2007 | Lam |
| 2002/0025244 A1 | 2/2002 | Kim |
| 2002/0088543 A1 | 7/2002 | Ashjaee et al. |
| 2002/0129707 A1 | 9/2002 | Tanaka et al. |
| 2003/0091410 A1 | 5/2003 | Larson et al. |
| 2004/0006544 A1 | 1/2004 | Gulett |
| 2004/0047714 A1 | 3/2004 | Poli et al. |
| 2004/0094087 A1 | 5/2004 | Ivanov et al. |
| 2004/0187451 A1 | 9/2004 | Suzuki et al. |
| 2006/0156978 A1* | 7/2006 | Lipson et al. ............... 118/708 |
| 2007/0055404 A1* | 3/2007 | Flitsch ............... 700/213 |
| 2007/0059130 A1* | 3/2007 | Flitsch ............... 414/217 |
| 2008/0089765 A1 | 4/2008 | Moriya et al. |

* cited by examiner

METHOD AND APPARATUS FOR AN AUTOMATED TOOL HANDLING SYSTEM FOR A MULTILEVEL CLEANSPACE FABRICATOR

CROSS REFERENCE TO RELATED APPLICATIONS

This application claims priority to the U.S. Provisional Patent Applications bearing the Ser. No. 61/745,996, filed Dec. 26, 2012 and entitled Method and Apparatus for a Robotic Tool Handling System for a Multilevel Cleanspace. The contents are relied upon and incorporated by reference. This application also claims priority to the U.S. patent application Ser. No. 11/502,689, filed Aug. 12, 2006 and entitled: "Method and Apparatus to support a Clean space Fabricator" as a continuation in part application. The U.S. patent application Ser. No. 11/502,689 in turn claims priority to the following Provisional Applications: Provisional Application, Ser. No. 60/596,343, filed Sep. 18, 2005 and entitled: "Specialized Methods for Substrate Processing for a Clean Space Where Processing Tools are Vertically Oriented"; and also Provisional Application, Ser. No. 60/596,173, filed Sep. 6, 2005 and entitled: "Method and Apparatus for Substrate Handling for a Clean Space Where Processing Tools are Reversibly Removable"; and also Provisional Application, Ser. No. 60/596,099, filed Aug. 31, 2005 and entitled: "Method and Apparatus for a Single Substrate Carrier For Semiconductor Processing"; and also Provisional Application, Ser. No. 60/596,053 filed Aug. 26, 2005 and entitled: "Method and Apparatus for an Elevator System for Tooling and Personnel for a Multilevel Cleanspace/Fabricator"; and also Provisional Application, Ser. No. 60/596,035 filed Aug. 25, 2005 and entitled: "Method and Apparatus for a Tool Chassis Support System for Simplified, Integrated and Reversible Installation of Process Tooling"; and also Provisional Application, Ser. No. 60/595,935 filed Aug. 18, 2005, and entitled: "Method and Apparatus for the Integrated, Flexible and Easily Reversible Connection of Utilities, Chemicals and Gasses to Process Tooling." This application also claims priority to the U.S. patent application Ser. No. 14/024,335, filed Sep. 11, 2013 and entitled "Method and Apparatus for a Cleanspace Fabricator" as a continuation in part application. The U.S. patent application Ser. No. 14/024,335 in turn claims priority to the U.S. patent application Ser. No. 11/933,280, filed Oct. 31, 2007 and entitled "Method and Apparatus for a Cleanspace Fabricator" now U.S. Pat. No. 8,641,824. The U.S. patent application Ser. No. 11/933,280 in turn claims priority to the U.S. patent application Ser. No. 11/156,205, filed Jun. 18, 2005 and entitled "Method and Apparatus for a Cleanspace Fabricator" now U.S. Pat. No. 7,513,822.

FIELD OF THE INVENTION

The present invention relates to apparatus and methods which support cleanspace fabricators and in particular to an automated tool replacement system supporting vertical and horizontal arrangement of fabricator tools operating in cleanspace environments.

BACKGROUND OF THE INVENTION

Cleanspace fabricator designs have been disclosed in previous patent applications that teach an arrangement of disparate tools in both vertical and horizontal dimensions.

In some particular embodiments, fabricators tools are arranged in close proximity, essentially in a matrix design. Each fabricator tool is associated with a cleanspace and a work piece, such as a semiconductor substrate, is transported from one fabricator tool cleanspace to another. Self contained carriers for transporting the substrate from one fabricator tool to another have also been disclosed, as well automation for transporting such carriers. Such carriers can be designed to maintain a clean space environment for the substrate, and, in some embodiments, a carrier can also provide atmospheric control.

In some implementations, fabricators with vertically arranged tools and disparate cleanspace environments can be built into a building structure itself. In such implementations, it is feasible to use conventional means, such as building elevators and forklifts to transport fabricator tools. However, some implementations provide for standalone fabricators in an open space, with vertically arranged fabricator tools. Stand alone implementations pose additional challenges for installing and removing tools. In particular, it would be difficult, if not impossible to install or remove a fabricator tool while maintaining the tool in a clean space environment.

The present invention compliments such designs by providing transport of fabricator tools to and from a particular cleanspace. In some embodiments, the transport is accomplished while maintaining a cleanspace environment about the fabricator tool being transported, thereby preserving an integrity of the tool.

SUMMARY OF THE INVENTION

Accordingly, the present invention provides methods and apparatus for transporting a fabricator tool to or from a cleanspace fabricator environment. In some embodiments the transport of the tool may occur within a tool replacement system defined in three dimensions by an atmospheric containment, such as a wall, divider or tent. Other embodiments may be defined by a robotic handling system that may not be surrounded by defined containment. Still other embodiments may have a robotic handler that is contained within the mentioned tool replacement system.

A cleanspace fabricator may be formed where processing tools are oriented in a multilevel environment. In some embodiments, there may also be multilevel of floors within the fabricator. In other embodiments there may be a single floor and multi-levels of tools. In addition the fabricator may also include a tool replacement system which may be automated. The tool replacement system may be used to replace a process tool in a given process tool location on a routine basis, such as in a non limiting sense more than once a day, more than once a month, or more than once a year. In some embodiments, there may be a primary cleanspace whose primary purpose may be to allow substrates to be moved from a first processing tool to a second processing tool, where the movement may be to different levels of tool locations or different levels within the fabricator. Robotic automation may be used to move substrate lots from a first tool to a second tool.

In another aspect, in some embodiments, a first cleanspace is defined which handles a first volume of clean air and in which one or more substrates or jobs are transported from one discrete processing tool to another discrete processing tool. A secondary cleanspace is defined which encompasses a body of at least one processing tool, wherein the port of the processing tool accesses the first cleanspace. Similar to a first cleanspace, the second cleanspace is defined by an atmospheric containment, such as a sealed divider or wall.

Further embodiments may derive from defining a tertiary Cleanspace onto the cleanspace fabricator in the location where tool access may occur. The tertiary cleanspace will be in physical proximity to a tool location, but the tertiary cleanspace will typically not be in atmospheric communication with either the first cleanspace or the second cleanspace. Some specific embodiments can include a tertiary cleanspace of sufficient volume and shape to remove the tool body form the secondary cleanspace while containing the processing tool in the tertiary cleanspace. In this manner, a tool may be services, updated or have preventive maintenance performed it, with a decreased risk of contamination of other tools exposed to the secondary cleanspace and yet maintain a clean environment for the tool being serviced.

In still another aspect, a tool replacement system can include a connecting surface connectable to a tool in a tool location in a multilevel fabricator. The connecting surface can include a perimeter or be surrounded by a perimeter, said perimeter defining an opening in at least one wall containing the work area, wherein the opening is large enough to allow a fabricator tool to pass through the opening. A support structure can support the tool replacement system and also include automation for transporting the tool replacement system in at least one of a horizontal direction and a vertical direction. Each direction can be relative to the cleanspace environment and may be relative to the periphery of the cleanspace environment surrounding tools. In some embodiments, where the tools have internal cleanspace control but do not require cleanspace conditions around their exterior, then the reference may be to a periphery of the region surrounding tool bodies. A seal can be present between the perimeter defining the opening and a surface of the cleanspace environment. The seal can be operative to preserve the integrity of an atmosphere defined by the cleanspace environment and an environment within the tool replacement system.

The methods and apparatus can also include wheels mounted proximate to a lowest portion of the support structure which are functional to provide movement to the support structure in the horizontal direction. Mechanization, which can be attached to the wheels, may be functional to elevate the tool replacement system, thereby providing movement in the vertical direction.

Automation for transporting the tool replacement system on a horizontal direction and a vertical direction can include multiple rails arrayed in a matrix along vertical and horizontal axes. A drive unit can be used which is operative to provide locomotion to the move the tool replacement system along at least one rail. It should be understood that the tool replacement system can include a clean room or other clean space.

Mechanized apparatus can be operative to position the fabricator tool in an operation location either automatically or under the direction of a human operator.

In another aspect, the tool replacement system can also include utility support for at least one of: tool diagnosis and repair. The utility support can include, for example, supply of one or more of: electricity, inert gas flow, chemicals, and chemical drain tanks.

Some embodiments can also include, monitoring equipment and circuitry, such as, for example, fire detection and remediation equipment, chemical detection and remediation, fluid detection and remediation. The monitoring equipment can be located throughout the apparatus described, including, without limitation, the tool replacement system additionally and a tool body location in a fabricator the tool replacement system.

In still another aspect, automation for transporting a tool replacement system in a vertical direction relative to the cleanspace environment can include, for example, a series of extension jacks activatable via motorized lead screw assemblies; automated hydraulic systems and stepper motors driving a system of cables and pulleys; and motorized arms with telescoping length capability.

Additional functionality included in some embodiments can include electronic circuitry which is functional to provide one or more of: wired or wireless electronic communication between at least two of: a fabricator in the tool replacement system, a fabricator tool adjacent to the tool replacement system and cleanspace fabricator automation. The electronic communication can also be functional to indicate a status of a fabricator tool to fab automation or other elevator machinery.

Still additional embodiments can include electronically interlocked safety systems which are functional to control the ability of a fabricator tool body to be moved into or out of the tool replacement system at various positions. Electronic sensors can be mounted to a tool replacement system and functional to monitor the environment of the tool replacement system for the presence of one more of: the presence of chemicals, temperature, moisture, and electrical charge. A control panel can include user activatable controls. Wherein said user activatable controls are operable to provide one or more of: vertical movement of the tool replacement system and horizontal movement of the tool replacement system. In some embodiments, identification apparatus can incorporate, for example, one or more of: a radio frequency identification tag and a scannable symbol to monitor and track fabricator tool location and elevator status and tool replacement system location and status.

Other embodiments can include methods of facilitating placement of a fabrication tool in a fabricator by elevating a tool replacement system and transporting the tool replacement system in one or more of a vertical direction and/or a horizontal direction to a tool location. In some embodiments, these embodiments may also include method steps where a fabricator supported by the tool replacement system may comprise at least a first cleanspace wherein substrates may be moved from a first fabricator tool to a second fabricator tool. In some embodiments said movement from a first fabricator tool to a second fabricator tool may be performed by robotic automation. A connecting surface can seal the tool replacement system to a tool location in the fabricator. The seal can be sufficient to maintain a cleanspace environment about a fabricator tool while the fabricator tool is transported between the tool replacement system and the tool location.

In some methods according to the embodiments herein, there may also be steps for placing and replacing tools by the use of robotic handlers, elevating the robotic tool handler, transporting the robotic tool handler in one or more of a horizontal direction and/or a vertical direction to a tool location in a fabricator, and removing a tool from an operational location or placing a tool into an operational location. In some embodiments the placing or removing of a tool may be performed automatically.

In still another aspect, the present invention and its methods can include performing at least one action contributing to the manufacture of one or more of: a semiconductor; photonic; microelectronic machines; biological composition and nanotechnology device. The action can be accomplished while maintaining a clean space environment in the area of manufacture, such as, for example in the first cleanspace and second cleanspace area.

Other aspects can include automation which is operable to transport a human operator to the tool location. Various embodiments can provide for transport of the human operator either within a tool replacement system or in a portion of an elevator used to transport the tool replacement system. A tool can be removed from a tool location into the tool replacement system where the human operator of other individual can perform a repair on the tool in the tool replacement system. The tool can also be replaced into the tool location.

Some embodiments can also provide for automatically controlling the position of a tool replacement system in relation to a particular tool location and automatically placing a fabricator tool in a tool location and connecting one or more utility services to the fabricator tool, wherein the utility services include at least one of: electricity, inert gas flow, chemicals, and chemical drain tanks.

BRIEF DESCRIPTION OF THE DRAWINGS

The accompanying drawings, that are incorporated in and constitute a part of this specification, illustrate several embodiments of the invention and, together with the description, serve to explain the principles of the invention.

Figure 1:
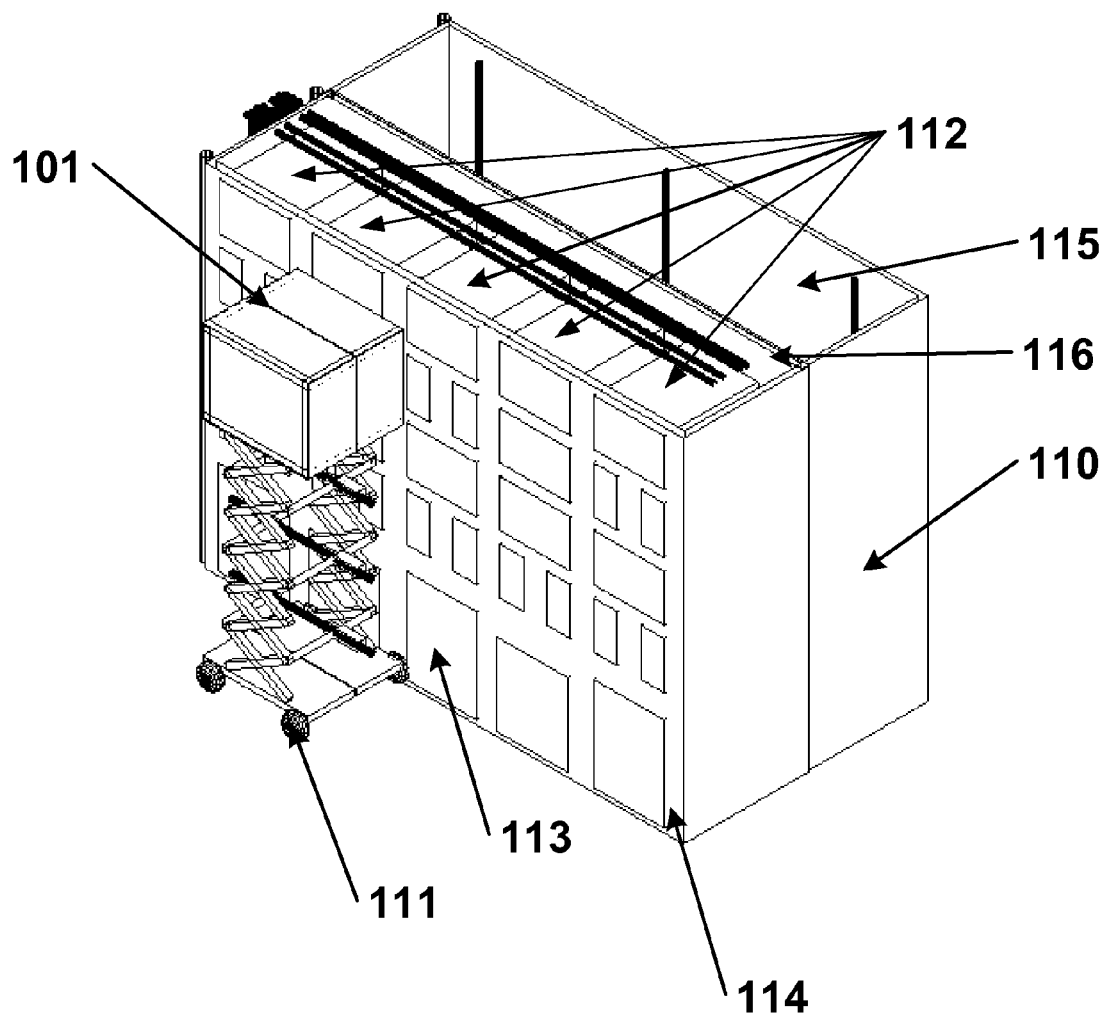
FIG. 1 illustrates a stand alone elevation cleanspace deployed next to a straight edged multilevel fab.

The accompanying drawings, that are incorporated in and constitute a part of this specification, illustrate several embodiments of the invention and, together with the description, serve to explain the principles of the invention:

DETAILED DESCRIPTION OF PREFERRED EMBODIMENTS

The present invention relates to methods and apparatus to support a cleanspace environment within which a material, such as an integrated circuit substrate, can be processed. In particular, according to the present invention, the support includes methods and apparatus which allow multiple fabrication tools used to process a material within the cleanspace to be arranged in a vertical and horizontal matrix. In some embodiments of the present invention, a portion of each fabrication tool can be made accessible from within a cleanspace in which the material is processed and an additional portion of each fabrication tool can be positioned within a separate cleanspace environment. A unique elevator is provided for transporting fabrication tools to and from various positions in the matrix and also allow for the fabrication tool to be placed into, or removed from, the matrix while maintaining the integrity of a cleanspace environment around the fabrication tool.

Reference will now be made in detail to different aspects of some preferred embodiments of the invention, examples of which are illustrated in the accompanying drawings. Wherever possible, the same reference numbers will be used throughout the drawings to refer to the same or like parts. A Glossary of Selected Terms is included at the end of this Detailed Description.

Traditionally, when installing a processing tool into a semiconductor fabricator, riggers had to place the tool in a designated position where the tool remained in place for its entire time in the fab. The present invention provides for an alternative strategy wherein processing tools can be routinely placed and removed from a fab location.

One aspect of the present invention therefore provides for support apparatus which facilitates efficient placement, removal and replacement of a processing tool in a predefined location. Predefined tool placement in turn facilitates predefined locations for utility interconnections and predefined locations for material transfer into and out of associated tool ports.

In some embodiments, a support fixture can further provide a chassis capable of receiving a processing tool and moving a processing tool from a position external to a cleanspace to an operational location. In some respects, movement of the tool from an installation position to an operational position can be envisioned much like a cabinet drawer moving from an outward position to a closed position.

Other aspects of some embodiments of the present invention include the connection of support items for proper operation of the processing tool. For example, electrical supplies, chemicals, gases, compressed air or other processing tool support can be passed through the tool chassis support system via flexible connections. Furthermore, the chassis body could support wired or wireless transfer of data. In addition, in some embodiments, a support chassis according to the present invention can include communication interfaces with safety systems to provide safe operation and safe removal and replacement.

It is the general intent of this invention to provide the physical framework for the support of locating processing tools in a fab where the tools are placed and replaced with some frequency and most or all of the tools are accessible from the exterior of the fabricator cleanspace and may be placed and replaced automatically. One aspect of a design that accomplishes these goals includes stacking tools in a vertical dimension to form a matrix. The scope of the present invention can include a matrix of a single column of fabrication tools ascending in a vertical dimension or a matrix including multiple columns of fabrication tools which adds horizontal dimension greater than one. The present invention supports both matrix designs with methods and apparatus which provide a cleanspace elevator that can lift tool bodies multiple levels in a clean environment. In various embodiments, the cleanspace elevator also provides transport in a horizontal dimension and maintains a clean space environment around a fabricator tool being transported.

In FIG. 1, various aspects of this invention are illustrated. An elevator body 101 is indexed on a $4^{th}$ level of a multilevel cleanspace fabricator 110 at the second major tool location in the horizontal dimension. A fabricator 110 is therefore illustrated of a type where each tool body (not illustrated in FIG. 1) is located in a disparate cleanspace 112.

According to some embodiments, each tool body 112 has a corresponding access panel 113 which can be removed to facilitate work on the corresponding tool body or replace the entire tool. In some embodiments the access panel may be withdrawn automatically. In order to support such an arrangement, a mobile elevated cleanspace 101 is provided which can be elevated and positioned proximate to a particular fabricator tool corresponding cleanspace regions 115, 116 and cleanspace periphery 114. The elevator can move in the horizontal dimension by a motor driven set of wheels as shown by item 111.

There are a number of types of cleanspace fabricators that may be possible with different orientations. For the purposes of illustration an exemplary type where the fab shape is planar, as FIG. 1 demonstrated, with tools oriented in vertical orientations may be used. An exemplary representation of what the internal structure of these types of fabs may look like is shown in a partial cross section representation in FIG. 2, item 200. Item 210 may represent the roof of such a fabricator where some of the roof has been removed to allow for a view into the internal structure. Additionally, items 220 may represent the external walls of the facility which are also removed in part to allow a view into external structure.

Figure 2:
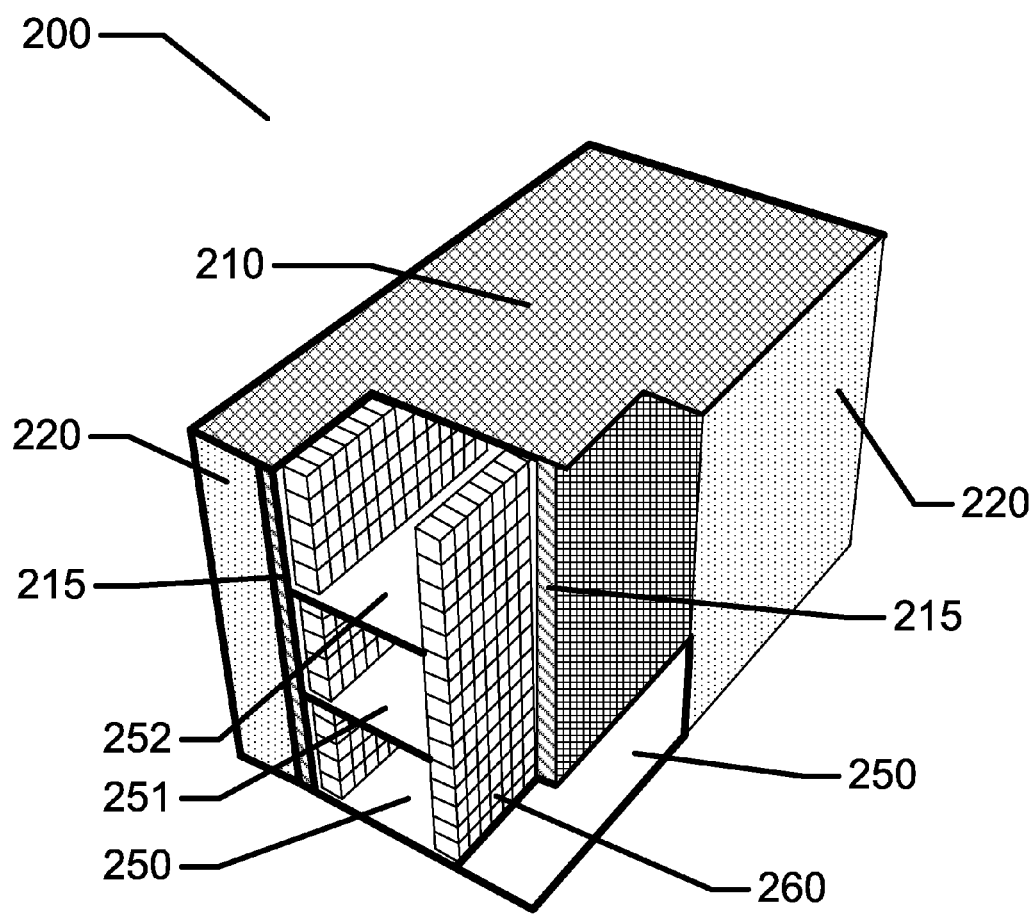
FIG. 2 illustrates an exemplary multilevel cleanspace fabricator.

In the linear and vertical cleanspace fabricator of FIG. 2 there are a number of aspects that may be observed in the representation. The "rotated and shrunken" cleanspace regions may be observed as items 215. The occurrence of item 215 on the right side of the figure is depicted with a portion of its length cut off to show its rough size in cross section. The cleanspaces lie adjacent to the tool pod locations. Depicted as item 260, the small cubical features represent tooling locations within the fabricator. These locations are located vertically and are adjacent to the cleanspace regions (215). In some embodiments a portion of the tool, the tool port, may protrude into the cleanspace region to interact with the automation that may reside in this region.

Items 250 may represent the fabricator floor or ground level. On the right side, portions of the fabricator support structure may be removed so that the section may be demonstrated. In between the tools and the cleanspace regions, the location of the floor 250 may represent the region where access is made to place and replace tooling. In this region, automated tool removal systems may be located.

In some embodiments, as in the one in FIG. 2, there may be two additional floors that are depicted as items 251 and 252. Other embodiments may have now flooring levels and access to the tools is made either by elevator means or by robotic automation that may be suspended from the ceiling of the fabricator or supported by the ground floor and allow for the automated removal, placement and replacement of tooling in the fabricator.

There may be various aspects a tool replacement system. The tool replacement system can have a box like body defined in three dimensions by walls. The interior can be maintained as a cleanspace area according to industry standards. For example, a HEPA filter based clean room ceiling can provide laminar type air, and a perforated floor, to allow for flow of air out of the elevated clean room. Controls can be situated inside the tool replacement system which a human operator inside the tool replacement system can use to control elevation and movement of the in the horizontal direction. In some embodiments aspects of the control may be automated and operate without a human operator.

In some embodiments, the area inside the tool replacement system can be sufficient for two or more tool bodies, so that a tool body being replaced can be removed from its place and a replacement tool body can be placed in the tool location cleanspace.

In some embodiments, elevation can be performed with mechanical structure operating on the principal of a scissor jack, such as, for example, via individual lead screw motors. Some embodiments can also include horizontal motion controlled via electric motors connected to a wheel based drive train. Other embodiments can include a rail system which guides a tool replacement system to a tool location via a matrix or collection of rails positioned in horizontal and/or vertical directions relative to the tool location. The use of overhead or on floor rail systems may also support the function of automated operation of tool changing operations. There may be mechanized apparatus that may be operative to position the processing tool in an operation location, wherein the mechanized apparatus may be a portion of the tool replacement system or a chassis system that may reside in the region comprising tools in the fabricator or both.

In another aspect, walls of the cleanspace which include an opening can be fitted with edge seals which can allow the elevator to be pushed against the fabricator to maintain a level of air cleanness when the vertical laminar flow air was actuated. The edge seals may be positioned with alignment fixtures located on the work module that allow for a reasonably precise docking in an appropriate location for tool replacement. In some embodiments the entire space of the elevated tool replacement system may be operated in a cleanspace environment.

In some embodiments the design of such an elevator tool replacement system may also accommodate various types of support facilities. These can include the electric power to not only run the elevator and cleanspace equipment but to potentially power elements of the tool bodies and testing/diagnostic equipment which can be incorporated into the elevator body. And, there can be automation capabilities incorporated into the elevator for transfer of data from tool bodies and test systems and the control equipment of the elevator itself to external automation systems, for example of the fab or of the tool bodies in the fab. Furthermore, since the operation of processing equipment involves various high energy sources, it can be natural for the elevated space to accommodate other safety apparatus like fire detection and remediation equipment and personnel safety monitoring equipment.

In some embodiments, utility services such as electrical power, data communication service, chemical supply, inert gas supply, compressed air, deionized water, chilled water, chemical drains, waste removal service and the like can be automatically connected, such as, for example, via a multiport flange.

There may be various embodiments of the present invention relating to different manners of elevating the tool replacement system. For example, as opposed to the previously discussed elevator, in some embodiments, the elevator can be affixed to the frame of a vertical cleanspace fabricator. In such embodiments, a frame can support a set of elevator motors at the top of the fabricator. The tool replacement system can be very similar in other ways than the elevation system. A tool replacement system may include the frame which can be elevated in its entirety by a series of motor driven cables and pulleys.

Figure 3:
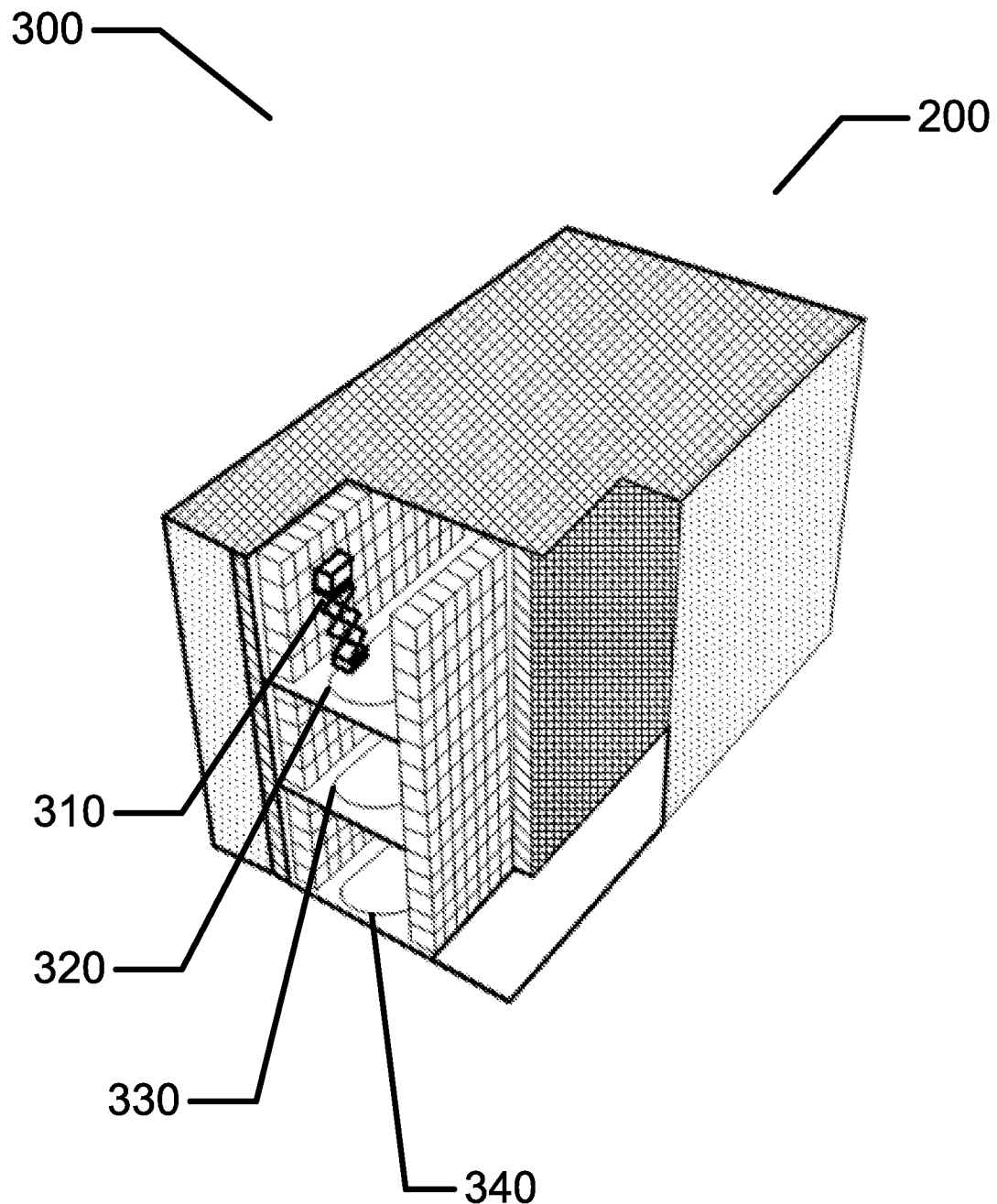
FIG. 3 illustrates tool handling robotics on a track system in the exemplary cleanspace fabricator type of FIG. 2.

Proceeding to FIG. 3, item 300 an embodiment similar to that depicted in FIG. 1 may be found in the fab type of FIG. 2, item 200. The fab may have three internal levels where each of the levels may have a track for guiding the tool replacement system item 310, along items 320, 330 and 340. The depicted tracks may proceed in a space large enough for a track on each side of the interior space. Other embodiments may have a reduced sized space such that a tool replacement system on a track down the middle can address tools on either sides. The elevator system of 310 may operate in automated manners and in some embodiments it may be able to operate without a track in a similar fashion to with a track, where automated guidance will keep the tool replacement system on a correct trajectory.

Figure 4:
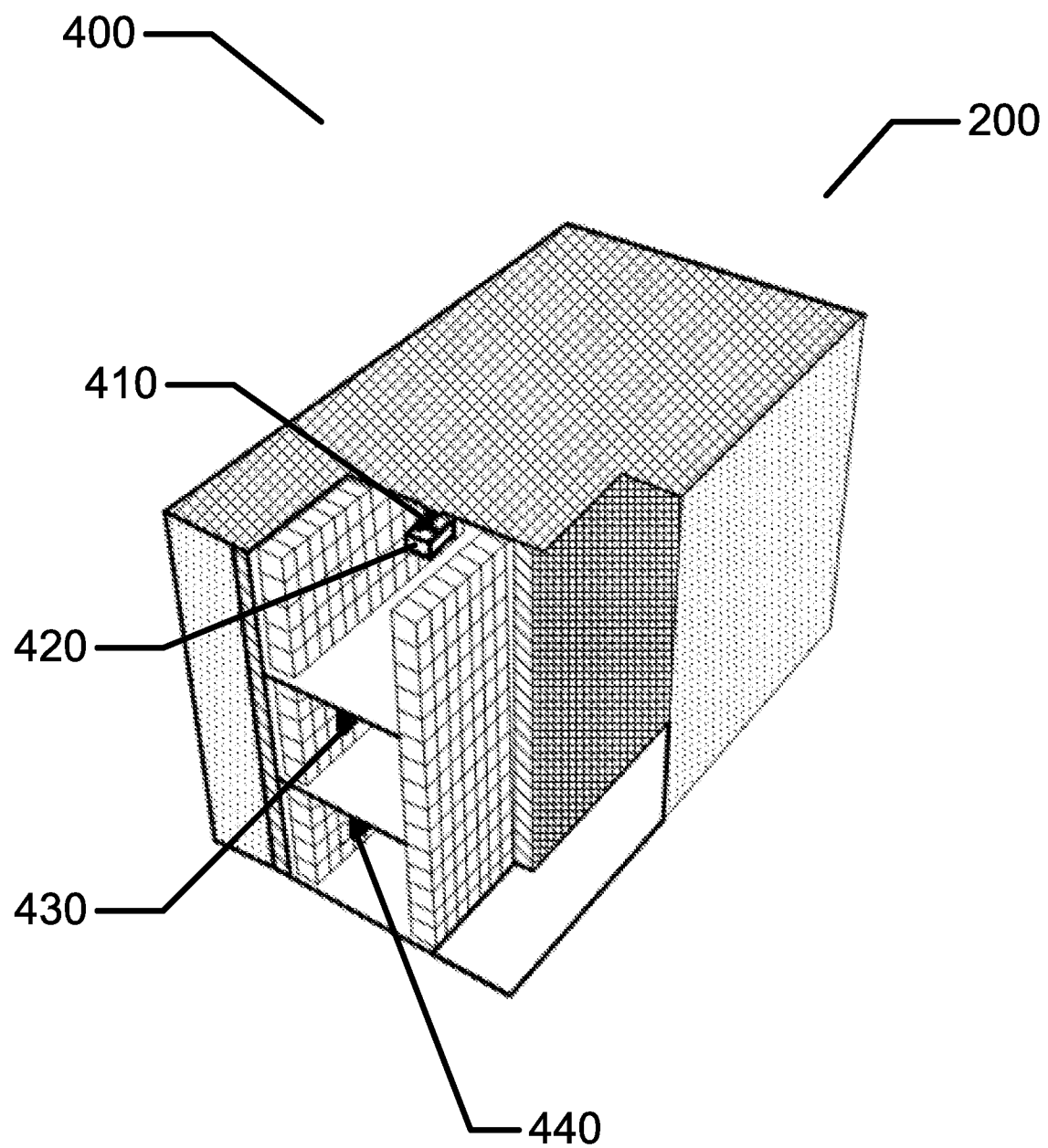
FIG. 4 illustrates tool handling robotics on a ceiling rail system in the exemplary cleanspace fabricator type of FIG. 2.

An alternative embodiment may be observed in FIG. 4, item 400. Again, using the exemplary Cleanspace Fabricator design of item 200 a tool replacement system may be oriented and guided by a track system oriented on a ceiling of each level. Item 410 may be a ceiling mounted track system along which a tool replacement system, item 420 may be guided. The depiction shows a single rail support, but other embodiments may use more than one rail. And, the tool replacement system may move from side to side to address tools on either side of the fab, which may be facilitated by multiple rails on the ceiling to distribute the forces as the tool replacement system moves and takes on the mass of tool bodies. The example of FIG. 4 depicts three levels with exemplary rails shown as item 430 and 440.

Figure 5:
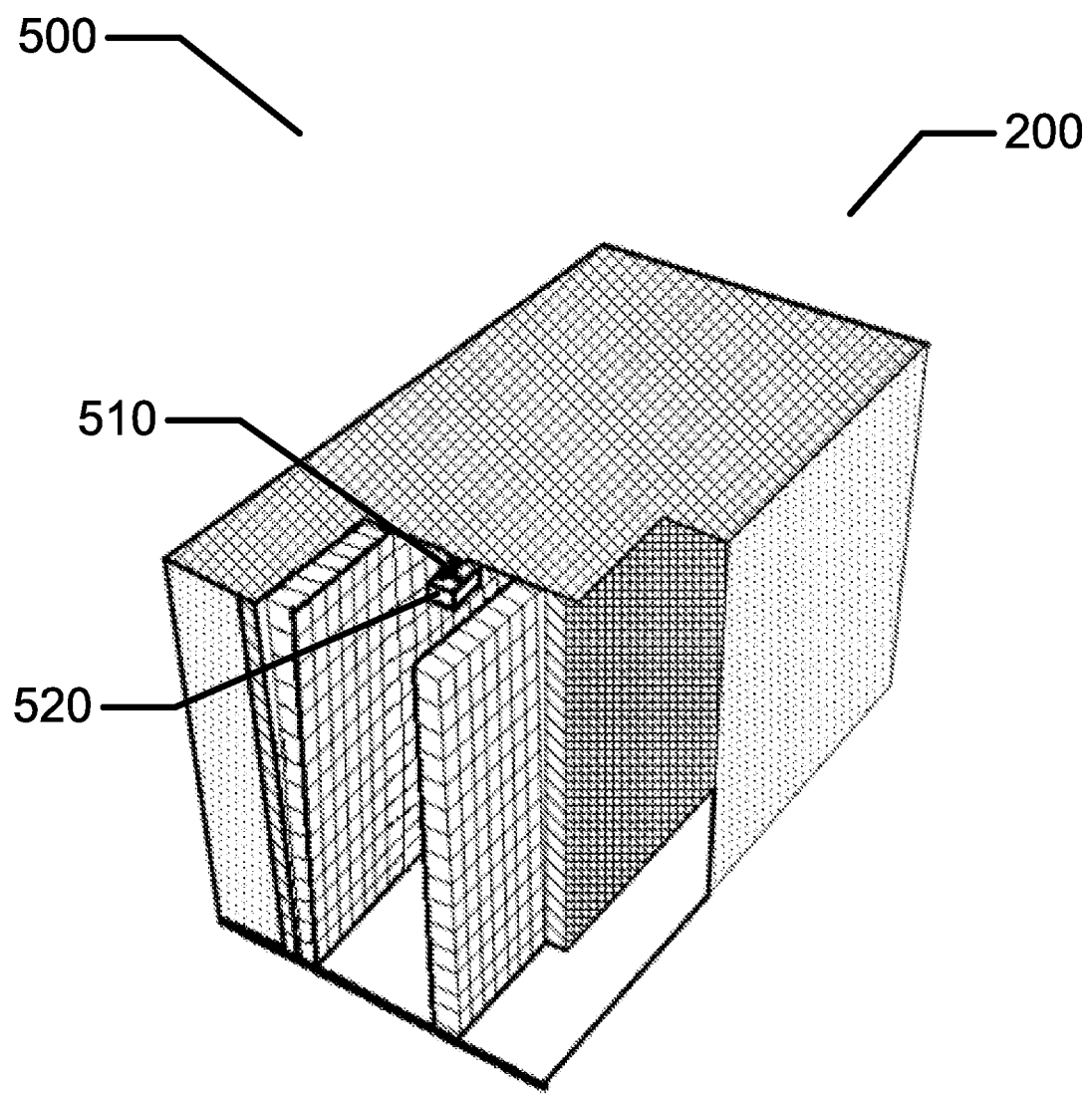
FIG. 5 illustrates another example of tool handling robotics on a ceiling rail system in a multilevel cleanspace fabricator with multiple tool levels but a single fab ceiling and floor level.

A still further embodiment may be found by proceeding to FIG. 5, item 500. A single level fabricator with vertically stacked and located tool bodies may be addressed by a single ceiling located track support system, item 510. A tool replacement system may be located as item 520.

Figure 6:
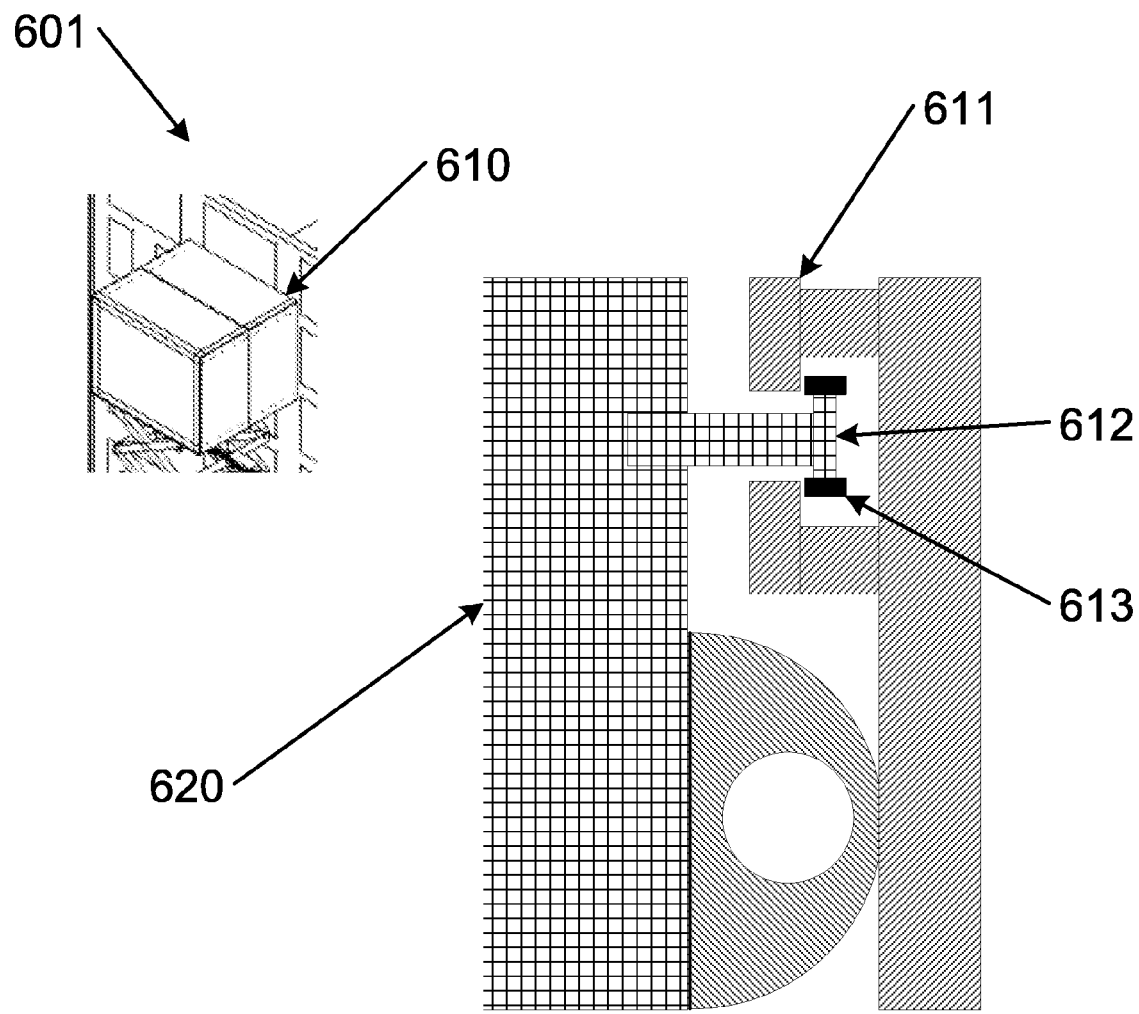
FIG. 6 illustrates a close up of exemplary edge sealing and alignment of tool handling robotics.

Since the support systems of the tool replacement system can service elevated heights, it can be prudent for support systems to be equipped with the capability to connect with the fabricator support structure in a flexible yet strong manner. Referring now to FIG. 6, such a structure is shown. In the exemplary embodiments illustrated in FIG. 6, an elevator body, 601, has a sealing edge 610, capable of connecting against the external face of the fabricator space.

In a region near this seal 610, the fabricator space can have an external rail slot mounted on the face of the wall. In some embodiments, a slot can begin at the second level of an elevator space. Therefore, when the elevator 501 is being put into service, it can be aligned with a desired position in the horizontal dimension. A tab, 612, with wheels, 613, on the elevator can be aligned with the slot, 611, and the elevator can be elevated to its desired vertical position. If there happened to be a deflection of the elevator body away from the fab wall, it can then be captured by this slot and tab and not deflect significantly for safety reasons. The slot and tab mechanisms may also be used to guide alignment of the tool replacement system relative to tool bodies; especially when the tool removal system is designed to operate in an autonomous mode.

In some embodiments, as a processing tool is connected, various aspects of tool automation electronics can monitor the connection and determine when the connections are in a safe operating mode. For example fire detection and remediation equipment can be included in the elevated tool replacement system module. In addition, tool automation electronics can communicate with a tool body and to the tool chassis to identify a state that the connections and supply conduits are in.

In still another aspect of the invention, in some embodiments, control automation can be contained within one or more of: the elevator apparatus and the tool replacement system module for various aspects of the operation of the systems and apparatus described herein. It is also within the scope of the present invention to automatically monitor and control multiple states related to the tool replacement systems 101, 310, 420 and 520 via electronic circuitry included in the tool replacement system. Such states can include, by way of example, a physical location of the tool replacement system and whether an associated chassis at a tool location is in an extended or closed state.

Therefore, for example, if a processing tool and chassis are in a closed state, a technical operator can issue a command to the chassis to move to an extended position in order to provide access to a tool mounted to the chassis as a tool replacement system becomes proximate to the chassis. In some embodiments the command may be issued in an automated fashion. Such communication can occur through a control panel or through wireless communication to the chassis through circuitry comprising wireless receivers. Accordingly, control of the tool replacement system 501, an elevator, a processing tool, or any of the other systems describe herein can be accomplished with any known machine controller technology, including for example a processor running executable software and generating a human readable interface.

In some embodiments, a command to move to the chassis to an extended location can also initiate, amongst other algorithmic functions, a check for the status of utilities connections. It is also within the scope of this invention to require any such utility connections to be rendered into a state of disconnect before the chassis can proceed to an extended position.

Similarly, in some embodiments, prior to operations such as extension of a chassis, processing steps can determine that a tool body did not contain any substrates prior to extension of the chassis. It is also within the scope of the present invention for communication modes included within the chassis to communicate with fabrication wide automation systems for purposes such as tracking the location of substrates; tracking the identity of tools; and tracking the status of tools. If connections to a tool and chassis are in a proper state then an elevator can approach the tool location of a particular chassis and the chassis can move into an extended position allowing, for example, for the removal of a tool contained therein and replacement with another tool body.

As described above, according to various embodiments of the present invention, each tool body can be individually removed and replaced in a standardized process and without requiring the removal of adjacent tool bodies. In addition, some embodiments provide for a fabrication tool to be maintained within a clean space environment during any of: removal, repair, transport and replacement. In still another aspect, some embodiments provide for the automatic removal of a tool from a first tool location and automatic placement of the tool in a second tool location, wherein all utilities connections are also automatically disconnected and reconnected accordingly.

In other embodiments, movement of a fabrication tool may be facilitated by a robotic tool handler. Essentially, a robotic tool handler can provide handling capabilities difficult or impossible for a human to perform. Accordingly, the robotic tool handler may provide one or more of: a degree to work force not generally available via human strength and a control of a degree of motion and stability not sustainable by direct human interaction. A robotic tool handler may be too heavy or awkward for a human to move into position to interact with a tool. Therefore the present invention provides a mechanism to move the robotic tool handler in one or both of a vertical and horizontal manner may be nearly identical to those embodiments describe herein and used to move a work area with three walls. In these embodiments however, the robotic handler may interface with tooling without the protective environment of the work area. Some of these embodiments may be enabled by having a tool chassis system that will isolate a tools location from the fabricator Cleanspace while any transfer of tools is occurring. In this manner, sealing a clean environment around the location of the tool body may not be required.

In embodiments where the robotic tool handler is used instead of a work area, the tool handler may have similar automation definitions to allow it to coordinate with a tool body that is intended to be removed. The tool body may move in an automated fashion to be in a location where the robotic tool handler may mechanically interface with it and move it physically. After removing a tool body and positioning it in a resting location, the robotic tool handler may interface to a replacement tool in an alternative resting location and move it. The replacement tool body may then be placed into the fabricator tool location vacated by the first tool.

Further embodiments may derive with robotic tool handlers. It may be apparent to one skilled in the art that numerous configurations of robotic machines may be consistent with moving tool bodies into and out of fabricator environments. In illustrative description of what may be apparent in the descriptions of the work area environment embodiments useful for moving and placing tools in various types of Cleanspace fabricators, a robotic tool handler may in fact reside within a tool replacement system. Such embodiments may facilitate the automated transfer of tools while maintaining a local Cleanspace environment around the transfer location during the transfer.

A different type of embodiment may derive using other concepts of Cleanspace fabricators. A Cleanspace fabricator may have multiple Cleanspace locations defined within itself. Prior patent disclosures have specifically defined a primary and secondary Cleanspace embodiment where the primary Cleanspace contains the embodiments for moving substrates from tool to tool. The secondary Cleanspace in these embodiments may contain the tool bodies and associated equipment. Additional Cleanspace locations may be possible. In a non limiting example of this concept, a tertiary Cleanspace may be defined to contain the embodiments to facilitate the automated transfer of tooling in a defined environment.

Figure 7:
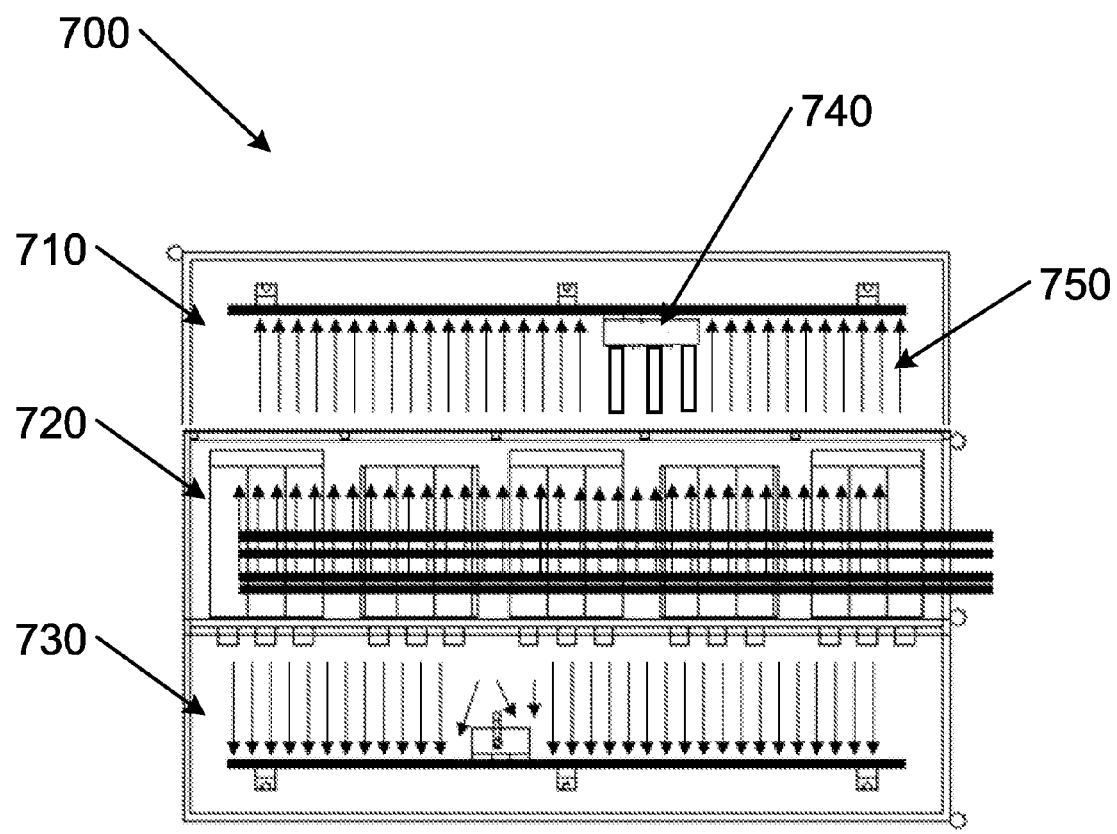
FIG. 7 illustrates a tertiary clean space for tool handling robotic area from a plan view.

Referring to FIG. 7, item 700 a tertiary Cleanspace may be seen as item 710. For illustrative purposes, one embodiment is where the airflow continues from the secondary Cleanspace 720 and then through the tertiary cleanspace. A primary Cleanspace 730 is shown for reference. In the tertiary Cleanspace 710 a unidirectional airflow 750 may be maintained. It is in this space that the automated transfer of tool bodies may occur with a tool replacement system 740.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

GLOSSARY OF SELECTED TERMS

Automation: The techniques and equipment used to achieve automatic operation, control or transportation.

Boundaries: A border or limit between two distinct spaces—in most cases herein as between two regions with different air particulate cleanliness levels.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Fab (or fabricator): as used herein means a facility including multiple tools and at least one cleanspace that is used to process substrates.

Flange: A protruding rim, edge, rib, or collar, used to strengthen an object, hold it in place, or attach it to another object. Typically herein, it is also to seal the region around the attachment.

Horizontal: A direction that is, or is close to being, perpendicular to the direction of gravitational force.

Logistics: A name for the general steps involved in transporting a job from one processing step to the next. Logistics can also encompass defining the correct tooling to perform a processing step and the scheduling of a processing step.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Process: A series of operations performed in the making or treatment of a product—herein primarily on the performing of said operations on substrates.

Substrates: A body or base layer, forming a product, that supports itself and the result of processes performed on it.

Tool (also sometimes referred to as a Fabrication Tool or Processing Tool): A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Utilities: A broad term covering the entities created or used to support fabrication environments or their tooling, but not the processing tooling or processing space itself. This may include electricity, gasses, air flows, chemicals (and other bulk materials) and environmental controls (e.g., temperature).

Vertical: A direction that is, or is close to being, parallel to the direction of gravitational force.

Tool replacement system: automation for one or both of: removing and inserting a Fabrication Tool or Fabrication Tool Body into a fabrication environment.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. A Cleanspace fabricator comprising:
a multilevel environment;
multiple processing tools, wherein said multiple processing tools are oriented in the multilevel environment; and
an automated tool replacement system, wherein the automated tool replacement system comprises:
- a robotic tool handler capable of transporting a processing tool,
- a connecting surface for the robotic tool handler, wherein said connecting
- surface is connectable to the processing tool, and
- a support structure for supporting the robotic tool handler, said support structure comprising an automation for transporting the robotic tool handler in at least one of a horizontal direction and a vertical direction,
- wherein said support structure is supported along a track affixed to a ceiling or a floor.

2. The apparatus of claim 1 wherein the support structure additionally comprises:
wheels mounted proximate to a lowest portion of the support structure, wherein said support structure is functional to provide movement in the horizontal direction; and further comprising a mechanization attached to the wheels, wherein said mechanization is functional to elevate the robotic tool handler thereby providing movement in the vertical direction.

3. The apparatus of claim 1 wherein the automation for transporting the robotic tool handler in the horizontal direction and the vertical direction comprises multiple rails and a drive unit operative to provide locomotion along at least one rail.

4. The apparatus of claim 1 additionally comprising a mechanized apparatus operative to position one or more of the multiple processing tools in an operation location.

5. The apparatus of claim 1 additionally comprising a robotic automation residing within the Cleanspace to move substrate lots from a first tool of the multiple tools to a second tool of the multiple tools.

6. The apparatus of claim 1 additionally comprising circuitry functional to provide one or more of: wired or wireless electronic communication between at least two of: a processing tool held by the robotic tool handler, a processing tool adjacent to the robotic tool handler and cleanspace fabricator automation.

7. The apparatus of claim 1 additionally comprising electronically interlocked safety systems functional to control an ability of a fabricator tool body to be moved into or out of the robotic tool handler at various positions.

* * * * *